US012635457B2

(12) United States Patent
Akimoto

(10) Patent No.: US 12,635,457 B2
(45) Date of Patent: May 19, 2026

(54) SUBSTRATE PROCESSING SYSTEM, SUBSTRATE PROCESSING METHOD, AND MAP CREATING DEVICE

(71) Applicant: Tokyo Electron Limited, Tokyo (JP)

(72) Inventor: Takeshi Akimoto, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 650 days.

(21) Appl. No.: 18/012,786

(22) PCT Filed: Jun. 16, 2021

(86) PCT No.: PCT/JP2021/022865
§ 371 (c)(1),
(2) Date: Dec. 23, 2022

(87) PCT Pub. No.: WO2021/261352
PCT Pub. Date: Dec. 30, 2021

(65) Prior Publication Data
US 2023/0253224 A1     Aug. 10, 2023

(30) Foreign Application Priority Data

Jun. 24, 2020     (JP) ................................. 2020-109003

(51) Int. Cl.
*H01L 21/67*          (2006.01)
*H01L 21/66*          (2006.01)
(52) U.S. Cl.
CPC .. *H01L 21/67288* (2013.01); *H01L 21/67253* (2013.01); *H01L 22/12* (2013.01)

(58) Field of Classification Search
CPC ......... H01L 21/67288; H01L 21/67253; H01L 22/12; H01L 22/20; H01L 21/67276;
(Continued)

(56) References Cited

U.S. PATENT DOCUMENTS 5,991,699  A  *  11/1999  Kulkarni ................. H01L 22/20
                                                        700/121
6,466,895  B1 *  10/2002  Harvey ................... H01L 22/20
                                                        850/62
(Continued)

FOREIGN PATENT DOCUMENTS

JP          2000223385  A  *   8/2000   ........ G01N 21/9501
JP          2002-359266  A      12/2002
(Continued)

*Primary Examiner* — Mohammed Shamsuzzaman
(74) *Attorney, Agent, or Firm* — Nath, Goldberg & Meyer; Jerald L. Meyer; Tanya E. Harkins

(57)          ABSTRACT
A substrate processing system, includes: a measurement device configured to measure errors of substrates after the substrates are subjected to processing of a first process by a first processing apparatus; a transfer device configured to transfer the substrates between apparatuses including the first processing apparatus, a second processing apparatus that performs processing of a second process after the first process, and the measurement device; a map creating device configured to create an error map indicating a distribution of the errors on the substrates; and an evaluation device configured to calculate an evaluation value indicating a degree of importance of the errors based on the error map, wherein the evaluation device instructs the transfer device on a transfer destination of the substrates subjected to the first process according to a determination result as to whether or not the evaluation value is equal to or larger than a predetermined first threshold value.

10 Claims, 12 Drawing Sheets

(58) Field of Classification Search
CPC ........ H01L 21/677; H01L 21/02; Y02P 70/50; Y02P 90/02; G05B 19/418
See application file for complete search history.

(56) References Cited

U.S. PATENT DOCUMENTS

| | | | | |
|---|---|---|---|---|
| 6,507,933 | B1* | 1/2003 | Kirsch | H01L 22/20 |
| | | | | 257/E21.525 |
| 7,043,325 | B1* | 5/2006 | Adams, III | G05B 19/41875 |
| | | | | 700/109 |
| 12,394,674 | B2* | 8/2025 | Chou | G03F 7/7065 |
| 2003/0011376 | A1* | 1/2003 | Matsushita | G01N 21/95607 |
| | | | | 438/14 |
| 2004/0026633 | A1* | 2/2004 | Gunji | H01J 37/244 |
| | | | | 250/492.1 |
| 2005/0004774 | A1* | 1/2005 | Volk | G03F 1/84 |
| | | | | 702/108 |
| 2007/0288219 | A1* | 12/2007 | Zafar | G06T 7/0008 |
| | | | | 703/14 |
| 2008/0311688 | A1* | 12/2008 | Yamashita | G06F 30/367 |
| | | | | 716/136 |
| 2009/0220142 | A1* | 9/2009 | Matsushita | G06T 7/0004 |
| | | | | 382/149 |
| 2015/0125068 | A1* | 5/2015 | Iwanaga | G06T 7/0004 |
| | | | | 382/149 |
| 2016/0163033 | A1* | 6/2016 | Vukkadala | G06F 18/22 |
| | | | | 382/145 |

FOREIGN PATENT DOCUMENTS

| | | | | |
|---|---|---|---|---|
| JP | 2004-117229 | A | 4/2004 | |
| JP | 2007-194262 | A | 8/2007 | |
| JP | 2012114147 | A * | 6/2012 | H01L 21/66 |

* cited by examiner

| Error amount range | Substrate number |
|---|---|
| 0～E001 | 39102 |
| E001～E002 | 5602 |
| E002～E003 | 741 |
| ⋮ | ⋮ |

FIG. 8

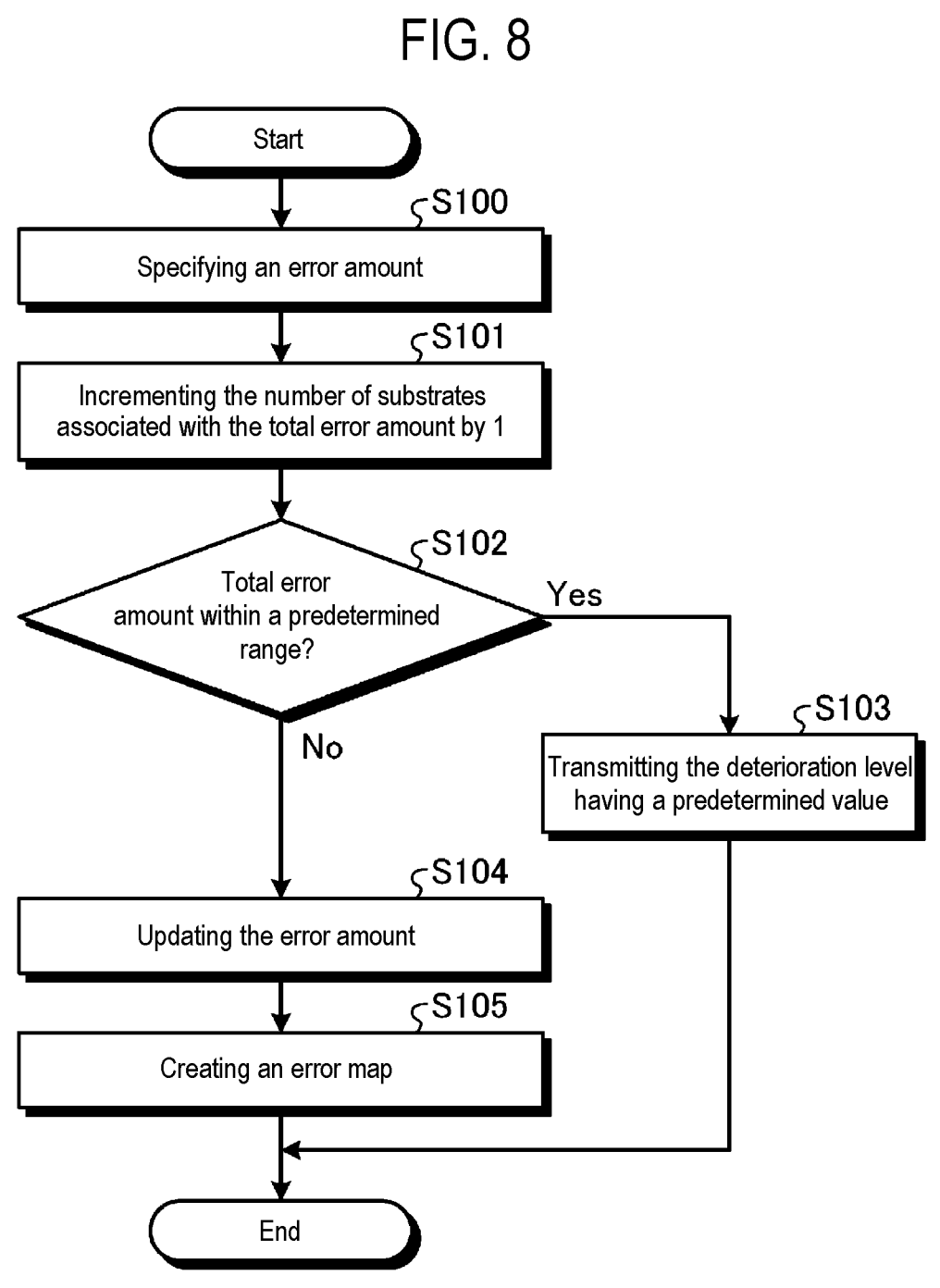

```
                    ┌─────────────┐
                    │    Start    │
                    └─────────────┘
                           │
                           ▼         ⌐S100
        ┌──────────────────────────────────────┐
        │      Specifying an error amount       │
        └──────────────────────────────────────┘
                           │
                           ▼         ⌐S101
        ┌──────────────────────────────────────┐
        │    Incrementing the number of         │
        │  substrates associated with the       │
        │     total error amount by 1           │
        └──────────────────────────────────────┘
                           │
                           ▼         ⌐S102
                  ╱─────────────────╲
                 ╱    Total error     ╲      Yes
                ╱ amount within a       ╲──────────────┐
                ╲ predetermined range?  ╱              │
                 ╲                     ╱                │
                  ╲─────────────────╱                  │
                           │ No                         ▼         ⌐S103
                           │              ┌──────────────────────────────┐
                           │              │ Transmitting the deterioration│
                           │              │  level having a predetermined │
                           │              │            value              │
                           ▼   ⌐S104      └──────────────────────────────┘
        ┌──────────────────────────────────────┐      │
        │       Updating the error amount       │      │
        └──────────────────────────────────────┘      │
                           │   ⌐S105                    │
        ┌──────────────────────────────────────┐      │
        │        Creating an error map          │      │
        └──────────────────────────────────────┘      │
                           │◄───────────────────────────┘
                           ▼
                    ┌─────────────┐
                    │     End     │
                    └─────────────┘
```

Figure 10:
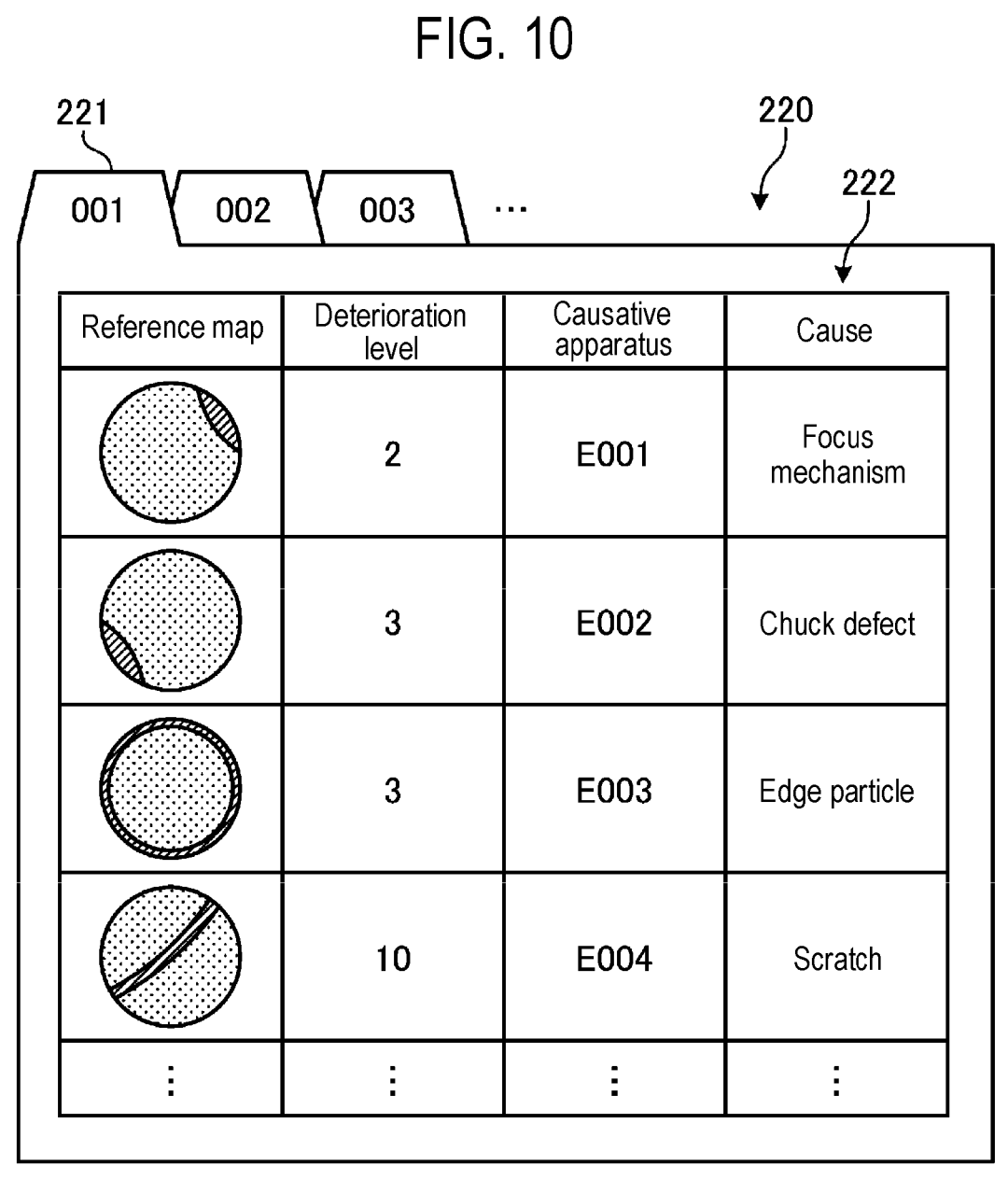

| Reference map | Deterioration level | Causative apparatus | Cause |
|---|---|---|---|
| | 2 | E001 | Focus mechanism |
| | 3 | E002 | Chuck defect |
| | 3 | E003 | Edge particle |
| | 10 | E004 | Scratch |
| ⋮ | ⋮ | ⋮ | ⋮ |

| 001 | 002 | 003 | ⋯ |

225

| Process ID | Degree of influence |
|------------|---------------------|
| P001 | 1 |
| P002 | 7 |
| P003 | 3 |
| ⋮ | ⋮ |

SUBSTRATE PROCESSING SYSTEM, SUBSTRATE PROCESSING METHOD, AND MAP CREATING DEVICE

This is a National Phase Application filed under 35 U.S.C. 371 as a national stage of PCT/JP2021/022865, filed Jun. 16, 2021, an application claiming the benefit of Japanese Application No. 2020-109003, filed Jun. 24, 2020, the content of each of which is hereby incorporated by reference in its entirety.

TECHNICAL FIELD

The present disclosure relates to a substrate processing system, a substrate processing method, and a map creating device.

BACKGROUND

Patent Document 1 below discloses a technique in which a distribution state of defects is analyzed based on defect position coordinates detected by an inspection device, and the defects are classified into distribution feature categories such as repeated defects, dense defects, arc-shaped distribution defects, radial distribution defects, linear distribution defects, ring/lump distribution defects, and the like. Thus, in a semiconductor wafer manufacturing process, the distribution state of defects can be analyzed based on the defect data detected by the inspection device, which makes it possible to easily identify the cause of defects caused by an apparatus or process.

PRIOR ART DOCUMENT

Patent Document

Patent Document 1: Japanese Laid-Open Publication No. 2004-117229

The present disclosure provides some embodiments of a substrate processing system, a substrate processing method, and a map creating device, which are capable of reducing processing waste.

SUMMARY

According to one embodiment of the present disclosure, a substrate processing system includes a measurement device, a transfer device, a map creating device, and an evaluation device. The measurement device measures errors of substrates after the substrates are subjected to processing of a first process by a first processing apparatus that performs processing of the first process on the substrates. The transfer device transfers the substrates between apparatuses including the first processing apparatus, a second processing apparatus that performs processing of a second process on the substrates after the first process, and the measurement device. The map creating device creates, for each of the substrates, an error map indicating a distribution of the errors on the substrates. The evaluation device calculates, for each of the substrates, an evaluation value indicating a degree of importance of the errors based on the error map. The evaluation device instructs the transfer device on a transfer destination of the substrates subjected to the first process according to a determination result as to whether or not the evaluation value is equal to or larger than a predetermined first threshold value.

According to the present disclosure, it is possible to reduce processing waste.

BRIEF DESCRIPTION OF DRAWINGS

FIG. 2 is a block diagram showing an example of a map creating device.

FIG. 8 is a flowchart showing an example of a process performed by the map creating device.

FIG. 9 is a block diagram showing an example of an evaluation device.

FIG. 10 is a diagram showing an example of a reference map table.

FIG. 11 is a diagram showing an example of an influence degree table.

DETAILED DESCRIPTION

Embodiments of a substrate processing system, a substrate processing method, and a map creating device will be described below in detail with reference to the drawings. It should be noted that the disclosed substrate processing system, substrate processing method, and map creating device are not limited by the following embodiments.

A semiconductor device manufacturing process includes multiple processes. In general, when processing of all processes is completed, a substrate is inspected to check whether the number of particles is equal to or less than a predetermined number and whether the electrical characteristics satisfy predetermined standards.

By the way, if the inspection is performed only after all the processes are completed, it is not determined whether the substrate does not satisfy the desired characteristics in the intermediate processes. Therefore, even if the substrate does not satisfy the desired characteristics in the intermediate processes, the processing is performed up to the final process. After the final process is performed, it is determined that the substrate does not satisfy the desired characteristics and thus, the substrate will be discarded. Subsequent processing performed on a substrate that does not satisfy the desired characteristics is wasteful processing. As a result, the operation time of the semiconductor manufacturing apparatus and the processing gas and electric power used during the operation time are wasted.

Therefore, the present disclosure provides a technique capable of reducing processing waste.

Configuration of Substrate Processing System 10

Figure 1:
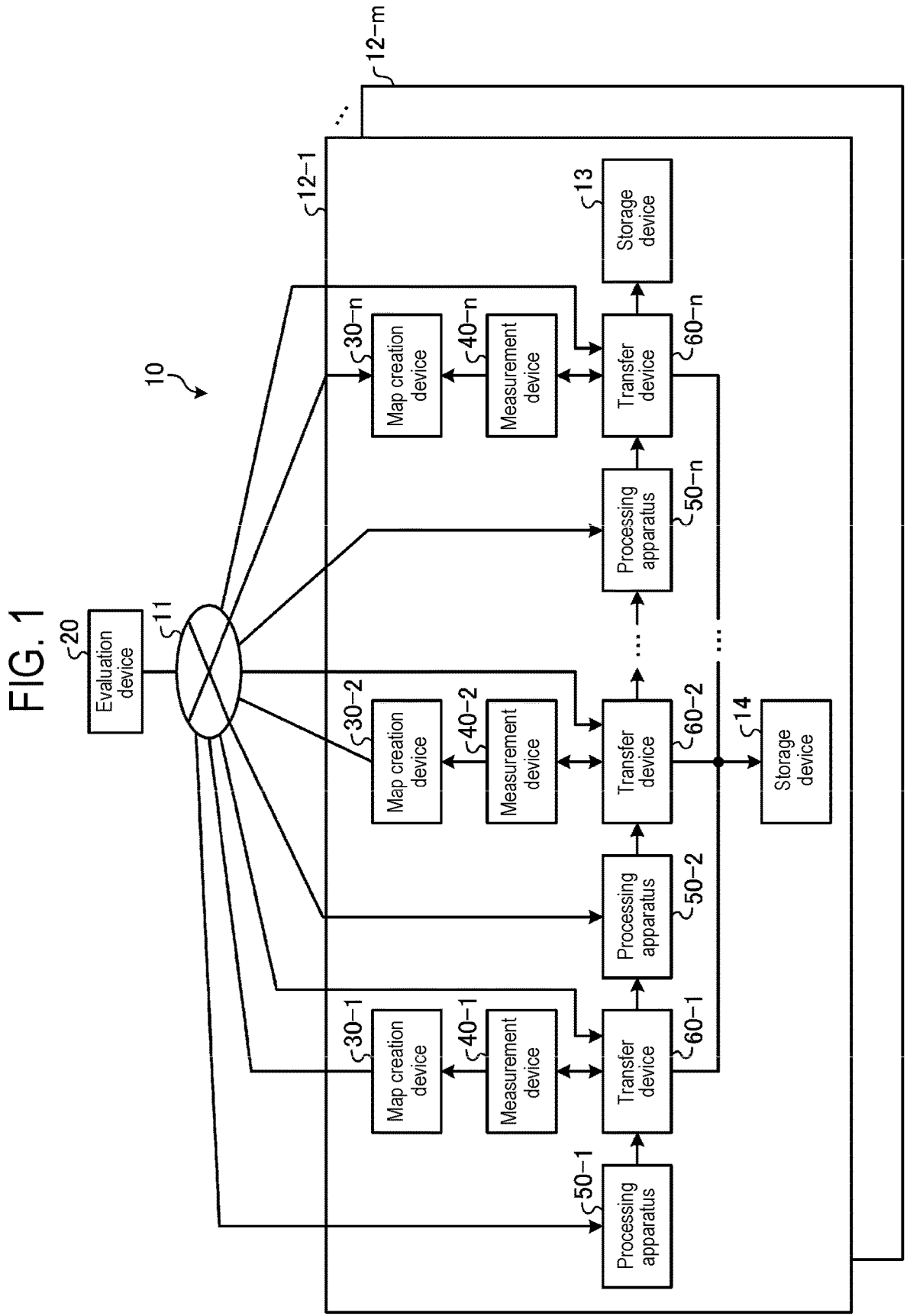
FIG. 1 is a system configuration diagram showing an example of a substrate processing system according to an embodiment of the present disclosure.

FIG. 1 is a system configuration diagram showing an example of a substrate processing system 10 according to an embodiment of the present disclosure. The substrate processing system 10 includes an evaluation device 20 and processing groups 12-1 to 12-m (where m is a natural number of 2 or more). The evaluation device 20 communicates with each of the processing groups 12-1 to 12-m via a communication network 11 such as a LAN (Local Area Network) or the like. Each of the processing groups 12-1 to 12-m includes map creating devices 30-1 to 30-n (where n is a natural number of 2 or more), measurement devices 40-1 to 40-n, processing apparatuses 50-1 to 50-n, transfer devices 60-1 to 60-n, a storage device 13, and a storage device 14.

In the following description, the processing groups 12-1 to 12-m are collectively referred to as processing group 12 when they are not distinguished from one another, and the map creating devices 30-1 to 30-n are collectively referred to as map creating device 30 when they are not distinguished from one another. Further, in the following description, the measurement devices 40-1 to 40-n are collectively referred to as measurement device 40 when they are not distinguished from one another, and the processing apparatuses 50-1 to 50-n are collectively referred to as processing apparatus 50 when they are not distinguished from one another. In addition, in the following description, the transfer devices 60-1 to 60-n are collectively referred to as transfer device 60 when they are not distinguished from one another.

Each processing apparatus 50 performs a process including cleaning, film-forming, etching, modifying, CMP (Chemical Mechanical Polishing), and the like on a substrate W. The processing apparatus 50-1 performs the processing of a first process on the substrate W. The processing apparatus 50-2 performs the processing of a second process on the substrate W after the first process. The processing apparatus 50-n performs the processing of an n-th process on the substrate W after the (n–1)th process. Each processing apparatus 50 may process one substrate W at a time, or may process multiple substrates W collectively. The processing apparatus 50-1 is an example of a first processing apparatus, and the processing apparatus 50-2 is an example of a second processing apparatus.

Each measurement device 40 measures an error of each substrate W processed by the processing apparatus 50. For example, the measurement device 40-1 measures an error of the substrate W on which the processing of the first process is performed by the processing apparatus 50-1, and outputs information on the measured error to the map creating device 30-1. Further, for example, the measurement device 40-n measures an error of the substrate W on which the processing of the n-th process is performed by the processing apparatus 50-n, and outputs information on the measured error to the map creating device 30-n. The error information of the substrate W includes, for example, information about errors related to particles on the substrate W, a thickness of a film formed on the substrate W, electrical characteristics of devices (hereinafter sometimes referred to as chips) formed on the substrate W, and the like.

Each map creating device 30 creates an error map indicating a distribution of errors on the substrate W based on the error information outputted from the measurement device 40 for each substrate W, and sends the created error map to the evaluation device 20 via the communication network 11. For example, the map creating device 30-1 creates an error map based on the error information measured by the measurement device 40-1, and the map creating device 30-n creates an error map based on the error information measured by the measurement device 40-n.

The storage device 13 stores the substrates W for which an evaluation value indicating a degree of importance of an error in each process is less than a predetermined value, i.e., the substrates W that satisfies predetermined criteria, among the substrates W processed in each processing group 12. On the other hand, the storage device 14 stores the substrates W for which an evaluation value in each process is equal to or larger than the predetermined value, i.e., the substrates W that do not satisfy the predetermined criteria, among the substrates W processed in each processing group 12. The substrates W stored in the storage device 14 are discarded.

Each transfer device 60 transfers the substrate W among the storage device 13, the storage device 14, the measurement device 40 and the processing apparatus 50 according to an instruction from the evaluation device 20. For example, the transfer device 60-1 transfers the substrate W processed in the first process by the processing apparatus 50-1 to the measurement device 40-1, and transfers the substrate W measured by the measurement device 40-1 to the processing apparatus 50-2 or the storage device 14 according to an instruction from the evaluation device 20. Further, the transfer device 60-n transfers the substrate W processed in the n-th process by the processing apparatus 50-n to the measurement device 40-n, and transfers the substrate W measured by the measurement device 40-n to the storage device 13 or the storage device 14 according to an instruction from the evaluation device 20.

The evaluation device 20 receives the error map for each substrate W from each map creating device 30 via the communication network 11, and calculates an evaluation value based on the received error map. Then, the evaluation device 20 controls a transfer destination of each substrate W based on the calculated evaluation value. For example, the evaluation device 20 determines the transfer destination of the substrate W according to the result of determination as to whether the evaluation value calculated based on the error map of the substrate W received from the map creating device 30-1 is equal to or larger than a predetermined value. For example, if the evaluation value is less than the predetermined value, the evaluation device 20 transmits to the transfer device 60-1 a control instruction to transfer the substrate W to the processing apparatus 50-2. On the other hand, if the evaluation value is equal to or larger than the predetermined value, the evaluation device 20 transmits to the transfer device 60-1 a control instruction to transfer the substrate W to the storage device 14. Further, for example, if the evaluation value calculated based on the error map of the substrate W received from the map creating device 30-n is less than a predetermined value, the evaluation device 20 transmits to the transfer device 60-n a control instruction to transfer the substrate W to the storage device 13. On the other hand, if the evaluation value calculated based on the error map of the substrate W received from the map creating device 30-n is equal to or larger than the predetermined value, the evaluation device 20 transmits to the transfer device 60-n a control instruction to transfer the substrate W to the storage device 14.

Configuration of Map Creating Device 30

Figure 2:
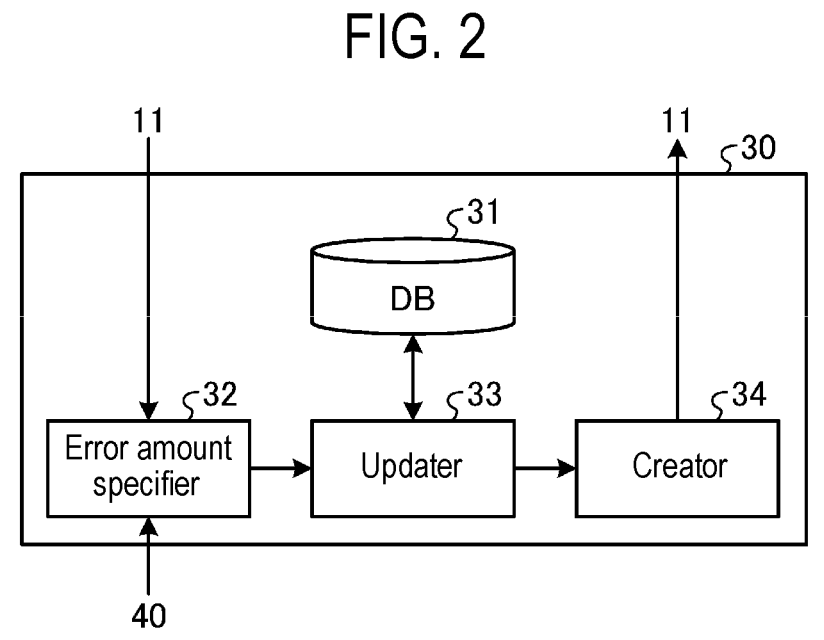

FIG. 2 is a block diagram showing an example of the map creating device 30. The map creating device 30 includes a DB (Data Base) 31, an error amount specifier 32, an updater 33, and a creator 34.

The error amount specifier 32 acquires a chip map, which is information indicating the arrangement of chips formed on the substrate W, from the evaluation device 20 via the communication network 11. Further, the error amount specifier 32 acquires error information for each substrate W from the measurement device 40. Then, the error amount specifier 32 specifies an error amount, which is a numerical value indicating an error amount in each chip region, for each substrate W based on the chip map. Then, the error amount specifier 32 outputs the value of the error amount for each specified chip region to the updater 33.

Figure 3:
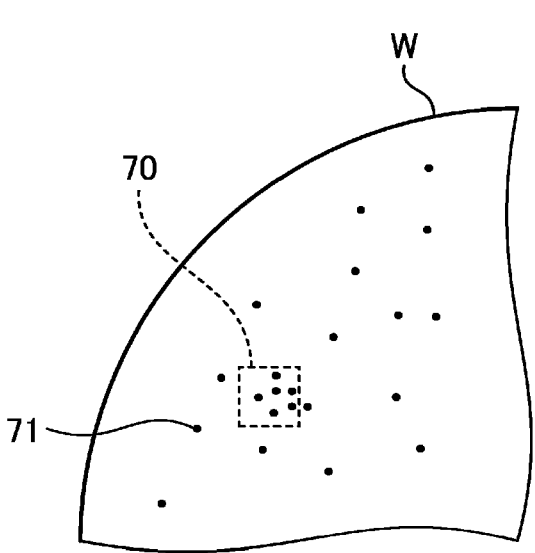
FIG. 3 is a diagram showing an example of an error amount specifying method.

For example, when the error information is coordinates of particles on the substrate W, the number of particles 71 in the chip region 70 is specified as the error amount in the chip region 70. In the example of FIG. 3, there are six particles 71 in the chip region 70. Therefore, the error amount is specified as "6."

Figure 4:
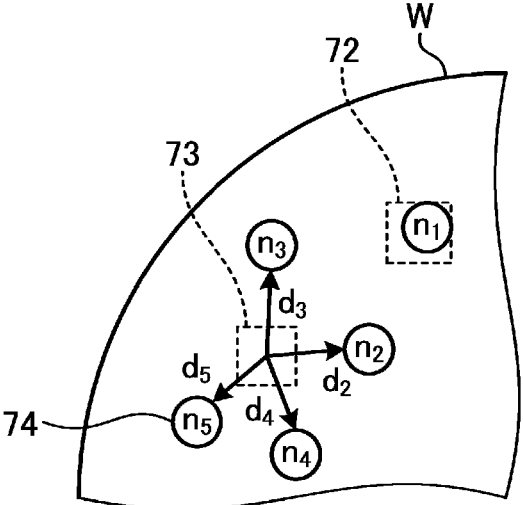
FIG. 4 is a diagram showing an example of an error amount specifying method.

Further, for example, when the error information is a difference between the measured film thickness and a target film thickness, if a chip region 72 includes a measurement position 74 (e.g., n1) where the film thickness is measured as shown in FIG. 4, the absolute value of the measured value is specified as the error amount of the chip region 72. On the other hand, if a chip region 73 does not include the measurement position 74, the absolute value of the value calculated by using the measured values at surrounding measurement positions 74 (n2 to n5) and distances (d2 to d5) from the chip region 73 to the respective measurement positions 74 is specified as the error amount in the chip region 73. In this case, the error amount specifier 32 specifies the error amount in the chip region 73 by using, for example, IDW (inverse distance weighting) or the like.

Further, for example, when the error information is electrical characteristics of each chip, the error amount in the chip region of a chip whose electrical characteristics satisfy a predetermined condition is specified as "0", for example. On the other hand, for example, the error amount in the chip region of a chip whose electrical characteristics do not satisfy the predetermined condition is specified as "1", for example.

Figure 5:
FIG. 5 is a diagram showing an example of an error table.

The DB 31 stores an error table 310 as shown in FIG. 5, for example. The error table 310 stores the number of substrates W for which a total value of error amounts in a total error amount value range has been measured in association with the total error amount value range. By referring to the data stored in the error table 310, it is possible to determine whether or not the total value of error amounts of the substrate W is included in a predetermined percentage in a descending order of error amounts in a frequency distribution of the total value of error amounts. In the error table 310, data on several substrates W measured by experiments or the like are pre-stored in an initial state.

The updater 33 calculates, for each substrate W, a total value of error amounts specified for each chip region. Then, the updater 33 refers to the error table 310 to specify a range of the error amount that includes the calculated total value of error amounts. Then, the updater 33 increments the number of substrates associated with the specified error amount range by one.

Next, the updater 33 determines whether or not the calculated total value of error amounts is within a predetermined range in the population showing a frequency distribution of the total value of error amounts of multiple substrates W stored in the error table 310. The predetermined range in the population is, for example, a range of less than "an average value of frequency distribution +3σ". "σ" is the standard deviation of the error amount distribution.

If the total value of error amounts is within a range of less than "the average value of frequency distribution +3σ", the updater 33 transmits a deterioration level of a predetermined value to the evaluation device 20 together with a product ID identifying the product, a process ID identifying the current process and a substrate ID identifying the substrate W. The deterioration level is a numerical value indicating a degree of deterioration of the cause of an error. The deterioration level of the predetermined value is, for example, "0". The current process is the process performed in, for example, the processing apparatus 50-1 in the case of the map creating device 30-1, and is the process performed in, for example, the processing apparatus 50-n in the case of the map creating device 30-n.

On the other hand, when the total value of the error amounts of the substrate W is within a range equal to or higher than "the average value of frequency distribution +3σ", the updater 33 updates the error amount for each chip region containing the error, i.e., for each chip region having an error amount value of 1 or more. In this way, by updating the error amount for each chip region for the substrates W for which the total value of error amounts is equal to or larger than "the average value of frequency distribution +3σ", it is possible to reduce the error amount updating processing as compared with a case where the error amount update processing is performed for all the substrates W.

For example, the updater 33 updates the error amount in each chip region containing an error to the total value of the error amount in the relevant chip region and the error amounts in other chip regions adjacent to the relevant chip region. Then, the updater 33 outputs the error amount updated for each chip region to the creator 34 for each substrate W.

Figure 6:
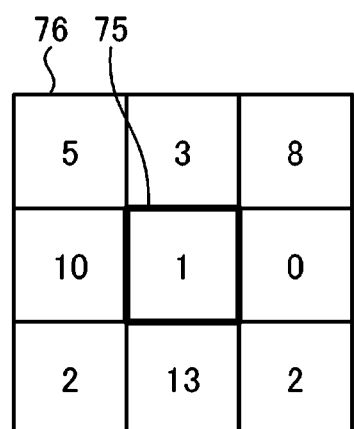
FIG. 6 is a diagram for explaining an example of an error amount updating method.
Figure 7:
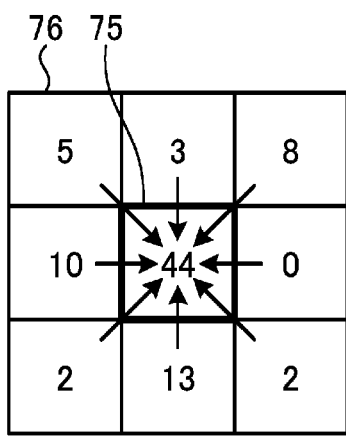
FIG. 7 is a diagram for explaining an example of an error amount updating method.

For example, a case where the error amount in the target chip region 75 is "1" and the error amounts in other chip regions 76 adjacent to the target chip region 75 are "5", "3", "8", "10", "0", "2", "13" and "2" as shown in FIG. 6 will be described as an example. Since the total value of the error amount in the chip region 75 and the error amounts in other chip regions 76 adjacent to the chip region 75 is "44", for example, as shown in FIG. 7, the updater 33 updates the error amount in the target chip region 75 to "44".

In this way, by adding the error amounts in other chip regions adjacent to each chip region containing an error, it is possible to emphasize the error in the region of the substrate W where errors are concentrated. This emphasizes the region where errors are concentrated, and emphasizes the characteristics of the error distribution.

Based on the frequency distribution of the error amounts for each chip region updated by the updater 33, the creator 34 specifies a predetermined percentage of chip regions in a descending order of error amounts among the multiple chip regions for each substrate W. The predetermined percentage is, for example, 3%. Then, the creator 34 creates an error map indicating a distribution of the specified chip regions, and transmits the created error map to the evaluation device 20 via the communication network 11 together with the product ID, the process ID and the substrate ID.

Processing of Map Creating Device 30

FIG. 8 is a flow chart showing an example of the processing of the map creating device 30. The processing illustrated in FIG. 8 is performed for each substrate W. For example, when error information is received from the measurement device 40, the map creating device 30 starts the processing illustrated in FIG. 8. The error amount specifier 32 receives the chip map from the evaluation device 20 via the communication network 11 before the processing illustrated in FIG. 8 is started.

First, the error amount specifier 32 specifies the error amount in each chip region based on the chip map (S100). Then, the error amount specifier 32 outputs the value of the error amount for each specified chip region to the updater 33.

Next, the updater 33 calculates the total value of the error amounts specified for each chip region, and refers to the error table 310 to specify the error amount range that includes the calculated total value of error amounts. Then, the updater 33 increments the number of substrates associated with the specified error amount range by 1 (S101).

Next, the updater 33 determines whether or not the calculated total value of error amounts is within a predetermined range in the population indicating the frequency distribution of total value of error amounts of multiple substrates W stored in the error table 310 (S102). If the calculated total value of error amounts is within the predetermined range (S102: Yes), the updater 33 transmits a deterioration level of a predetermined value to the evaluation device 20 together with a product ID, a process ID, and a substrate ID (S103). Then, the map creating device 30 terminates the processing shown in the flowchart.

On the other hand, if the calculated total value of error amounts is not within the predetermined range (S102: No), the updater 33 updates the error amount for each chip region including the error by adding the error amounts of other chip regions adjacent to the chip region (S104). Then, the updater 33 outputs the updated error amount for each chip region to the creator 34.

Next, the creator 34 specifies a predetermined percentage of chip regions in a descending order of error amounts among the multiple chip regions based on the frequency distribution of the error amounts for each chip region updated by the updater 33. Then, the creator 34 creates an error map indicating the distribution of the specified chip regions (S105). Step S105 is an example of the process (h). Then, the creator 34 transmits the created error map to the evaluation device 20 via the communication network 11 together with a product ID, a process ID, and a substrate ID. The map creating device 30 terminates the processing shown in the flowchart.

Configuration of Evaluation Device 20

Figure 9:
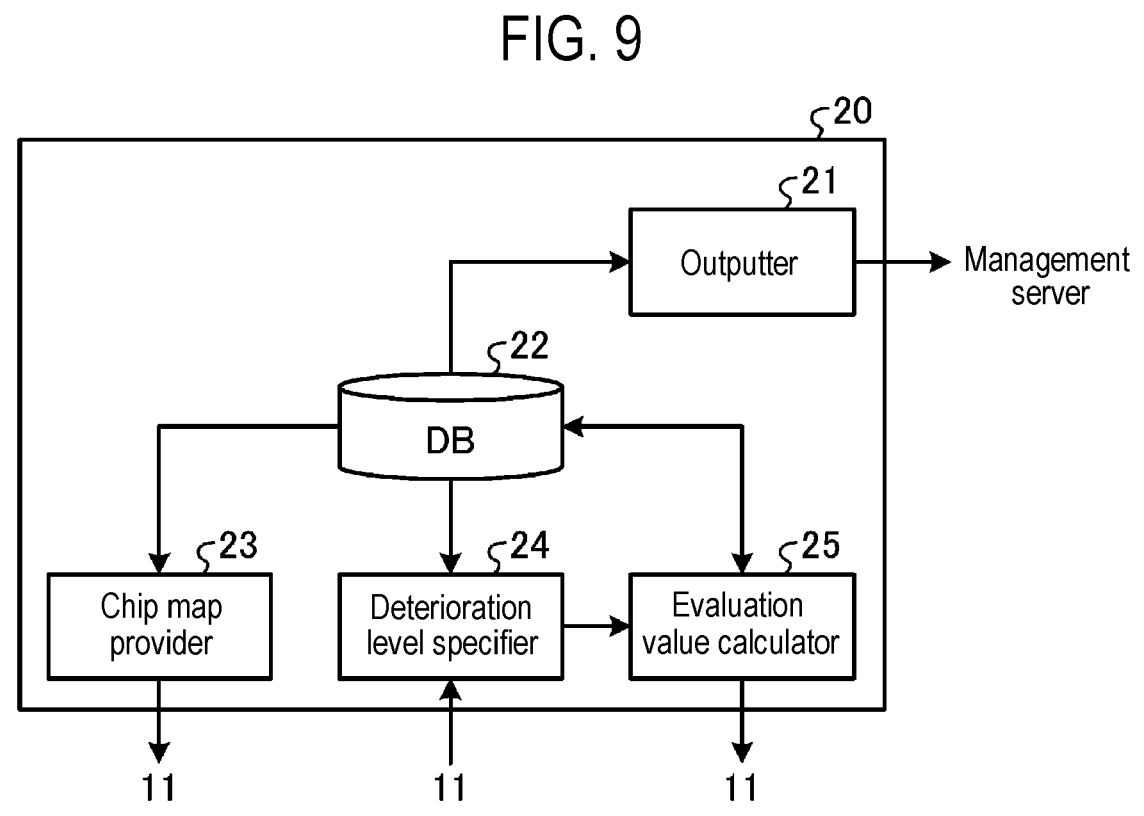

FIG. 9 is a block diagram showing an example of the evaluation device 20. The evaluation device 20 includes an outputter 21, a DB 22, a chip map provider 23, a deterioration level specifier 24 and an evaluation value calculator 25.

The DB 22 stores a chip map for each product. Further, the DB 22 stores a reference map table, an influence degree table, and an evaluation value table. FIG. 10 is a diagram showing an example of the reference map table 220. An individual table 222 for each product ID 221 is stored in the reference map table 220. The individual table 222 stores the deterioration level, the causative apparatus, and the cause in association with the reference map. The reference map is an error map indicating a predetermined distribution of errors. The deterioration level is a numerical value indicating the degree of deterioration of the cause of the error corresponding to the reference map. The causative apparatus indicates identification information of the apparatus that causes the error. The cause indicates the cause of the error. The chip map for each product does not necessarily have to be stored in the DB 22. The evaluation device 20 may acquire the chip map for the corresponding product from a host management server or the like each time when the product is processed.

FIG. 11 is a diagram showing an example of an influence degree table 223. The influence degree table 223 stores an individual table 225 for each product ID 224. The individual table 225 stores an influence degree indicating the magnitude of the influence at the time of occurrence of an error in the process in association with the process ID that identifies the process.

Figure 12:
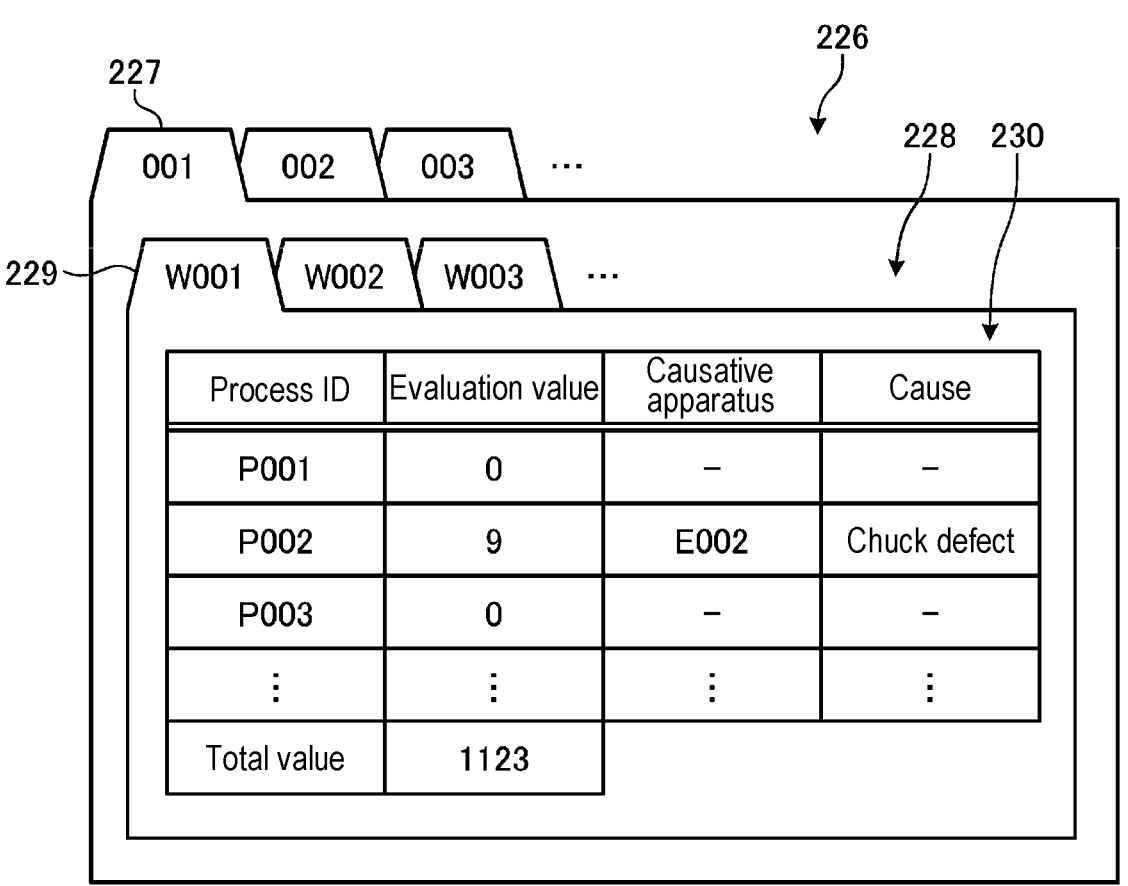
FIG. 12 is a diagram showing an example of an evaluation value table.

FIG. 12 is a diagram showing an example of an evaluation value table 226. The evaluation value table 226 stores an individual table 228 for each product ID 227. The individual table 228 stores an individual table 230 for each substrate ID 229. In the individual table 230, an evaluation value calculated in the process corresponding to the process ID, the causative apparatus for identifying the apparatus that becomes the cause of occurrence of an error in the process, and the cause are stored in association with the process ID. The individual table 230 also stores a total evaluation value.

Returning to FIG. 9, the chip map provider 23 provides the chip map of the product stored in the DB 22 via the communication network 11 to each map creating device 30 included in the processing group 12 that manufactures the product.

When the deterioration level specifier 24 receives the error map together with the product ID, the process ID, and the substrate ID from the map creating device 30 via the communication network 11, the deterioration level specifier 24 refers to the reference map table 220 in the DB 22 to specify the individual table 222 corresponding to the received product ID. Then, the deterioration level specifier 24 specifies one reference map having the highest similarity to the received error map from among the reference maps stored in the specified individual table 222. The deterioration level specifier 24 specifies one reference map having the highest similarity to the received error map by using, for example, a CNN (Convolutional Neural Network) or NMF (Non Negative Matrix Factorization).

Then, the deterioration level specifier 24 refers to the individual table 222 to specify the deterioration level, the causative apparatus, and the cause associated with the specified reference map. Then, the deterioration level specifier 24 outputs the specified deterioration level to the evaluation value calculator 25 together with the causative apparatus, the cause, the product ID, the process ID, and the substrate ID associated with the specified deterioration level.

Further, when the deterioration level specifier 24 receives a predetermined deterioration level (e.g., "0") together with the product ID, the process ID, and the substrate ID from the map creating device 30, the deterioration level specifier 24 outputs the received deterioration level to the evaluation value calculator 25 together with the product ID, the process ID, and the substrate ID. In this case, the causative apparatus and the cause are not outputted to the evaluation value calculator 25.

When the deterioration level, the product ID, the process ID, and the substrate ID are outputted from the deterioration level specifier 24, the evaluation value calculator 25 refers to the influence degree table 223 in the DB 22 to specify the individual table 225 corresponding to the product ID. Then, the evaluation value calculator 25 refers to the specified individual table 225 to extract the influence degree associated with the process ID.

Then, the evaluation value calculator 25 calculates a product of the deterioration level outputted from the deterioration level specifier 24 and the influence degree extracted from the individual table 225 as an evaluation value of the substrate W after the processing of the process corresponding to the process ID is performed. For example, when the deterioration level outputted from the deterioration level specifier 24 is "2" and the influence degree extracted from the individual table 225 is "3", the evaluation value calculator 25 calculates the evaluation value as "6".

Next, the evaluation value calculator 25 determines whether or not the calculated evaluation value is equal to or larger than a first threshold value. When the calculated evaluation value is less than the first threshold value, the evaluation value calculator 25 transmits a control instruction to the transfer device 60, which transfers the substrate W in the process corresponding to the process ID, to transfer the substrate W to the processing apparatus 50, which performs the next process. If the process corresponding to the process ID is the n-th process, the evaluation value calculator 25 transmits a control instruction instructing the transfer device 60-$n$ to transfer the substrate W to the storage device 13.

On the other hand, if the calculated evaluation value is equal to or larger than the first threshold value, the evaluation value calculator 25 transmits a control instruction to the transfer device 60, which transfers the substrate W in the process corresponding to the process ID, to transfer the substrate W to the storage device 14. As a result, the substrate W is discarded. This makes it possible to prevent the substrate W containing a large error from being wastefully processed. In this embodiment, the first threshold value is, for example, "30".

Further, when the calculated evaluation value is equal to or larger than a second threshold value larger than the first threshold value, the evaluation value calculator 25 further transmits a control instruction to the process ID to stop the processing apparatus 50 that performs the processing of the process corresponding. As a result, it is possible to stop the processing apparatus 50 that causes a large error, and prevent the substrate W containing an error from being manufactured. In this embodiment, the second threshold value is, for example, "70". When the processing apparatus 50 is stopped, the evaluation value calculator 25 may notify the user or the like of the evaluation device 20 that the processing apparatus 50 has been stopped.

Next, the evaluation value calculator 25 refers to the evaluation value table 226 in the DB 22 to specify the individual table 228 corresponding to the product ID outputted from the deterioration level specifier 24. Then, the evaluation value calculator 25 specifies the individual table 230 corresponding to the substrate ID outputted from the deterioration level specifier 24 in the specified individual table 228. Then, the evaluation value calculator 25 stores the calculated evaluation value in the specified individual table 230 in association with the process ID outputted from the deterioration level specifier 24.

When the causative apparatus and the cause are outputted from the deterioration level specifier 24 together with the process ID, the evaluation value calculator 25 associates the calculated evaluation value, the causative apparatus and the cause with the process ID and stores them in the individual table 230. Then, when the process ID is the process ID corresponding to the last process, the evaluation value calculator 25 stores the total evaluation value of each process in the individual table 230. Even when the substrate W is discarded or the processing apparatus 50 is stopped, the evaluation values, the causative apparatuses, and the causes up to that process are stored in the individual table 230.

The outputter 21 outputs data in the evaluation value table 226 to a management server that manages information on multiple substrates W. The outputter 21 may output the data in the evaluation value table 226 to a monitor, printer, or the like connected to the evaluation device 20.

Operation of Substrate Processing System 10

Figure 13:
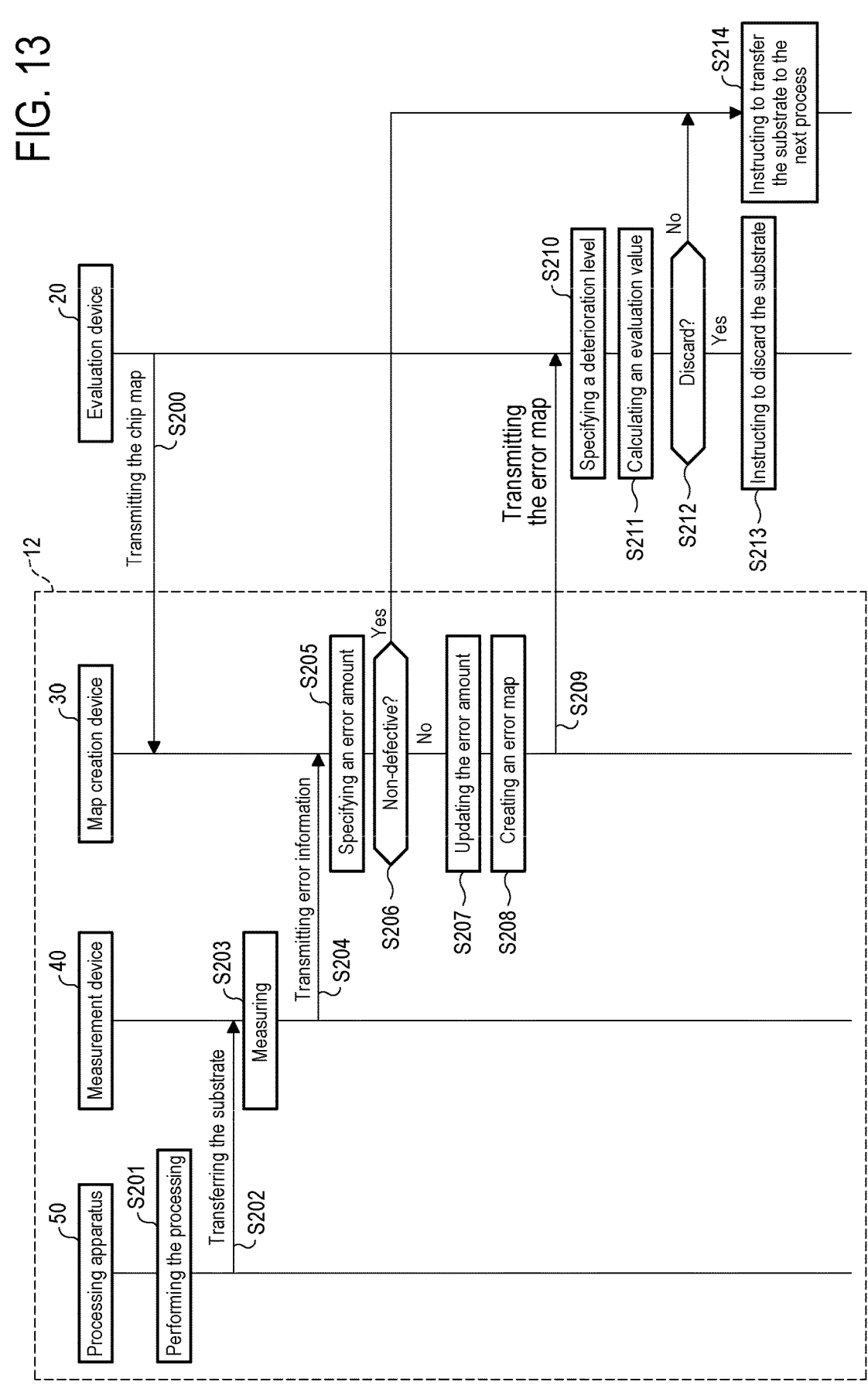
FIG. 13 is a sequence diagram showing an example of an operation of the substrate processing system.

Next, FIG. 13 is a sequence diagram showing an example of the operation of the substrate processing system 10.

First, the chip map provider 23 of the evaluation device 20 transmits the chip map corresponding to the product to each map creating device 30 in the processing group 12 that manufactures the product through the communication network 11 (S200). The map creating device 30 acquires the chip map. Step S200 is an example of process (e).

Next, the processing apparatus 50 performs processing of a predetermined process on the substrate W (S201). Then, the transfer device 60 transfers the substrate W from the processing apparatus 50 to the measurement device 40 (S202).

Next, the measurement device 40 measures an error of the substrate W for each substrate W (S203). Step S203 is an example of process (a). Then, the measurement device 40 outputs information on the measured error for each substrate W to the map creating device 30 (S204).

Next, the error amount specifier 32 of the map creating device 30 specifies an error amount in each chip region for each substrate W by using the chip map received from the evaluation device 20 and the error information outputted from the measurement device 40 (S205). Step S205 is an example of process (f).

Next, the updater 33 determines whether or not the substrate W is a non-defective product by determining whether or not the specified total value of error amounts is within a predetermined range in the population indicating the frequency distribution of the total value of error amounts of the multiple substrates W stored in the error table 310 (S206). When the substrate W is determined to be a non-defective product (S206: Yes), the map creating device 30 notifies the evaluation device 20 to that effect. The evaluation device 20 instructs the transfer device 60 to transfer the substrate W to the processing apparatus 50 that performs the next process (S214). The transfer device 60 transfers the substrate W whose error has been measured by the measurement device 40 to the processing apparatus 50 that performs the next process.

On the other hand, if the substrate W is not determined to be a non-defective product (S206: No), the updater 33 of the map creating device 30 updates the error amount for each chip region containing an error with respect to the substrate W whose total value of error amounts is within a range equal to or higher than "the average value +3σ", in the distribution of the total values of error amounts in multiple substrates W (S207). In step S207, for each chip region containing an error, the error amounts of other chip regions adjacent to the chip region are added. Step S207 is an example of the process (g).

Next, the creator 34 of the map creating device 30 creates an error map for each substrate W (S208). Step S208 is an example of process (b). In step S208, the creator 34 specifies a predetermined percentage of chip regions in a descending order of error amounts among multiple chip regions based on the error amount distribution for each chip region updated by the updater 33. Then, the creator 34 creates an error map indicating the distribution of the specified chip regions, and transmits the created error map to the evaluation device 20 via the communication network 11 together with a product ID, a process ID, and a substrate ID (S209).

Next, the deterioration level specifier 24 of the evaluation device 20 refers to the reference map table 220 in the DB 22, specifies one reference map that has the highest similarity to the received error map, and specifies the deterioration level associated with the specified reference map (S210). Then, the deterioration level specifier 24 outputs the specified deterioration level, and the causative apparatus, the cause, the product ID, the process ID, and the substrate ID associated with the deterioration level to the evaluation value calculator 25.

Next, the evaluation value calculator 25 of the evaluation device 20 refers to the influence degree table 223 in the DB 22 for each substrate W and extracts the influence degree of the process. Then, the evaluation value calculator 25 calculates the product of the extracted influence degree and the deterioration level as the evaluation value of the substrate W after processing of that process is performed (S211). Step S211 is an example of process (c).

Next, the evaluation value calculator 25 determines whether or not to discard the substrate W by determining whether or not the calculated evaluation value is equal to or larger than a first threshold value (S212). If it is determined not to discard the substrate W (S212: No), the processing shown in step S214 is performed. Then, the evaluation value calculator 25 stores the evaluation value in the DB 22.

On the other hand, when it is determined to discard the substrate W, the evaluation value calculator 25 instructs transfer device 60 to discard the substrate W by sending a control instruction instructing the transfer device 60 to transfer the substrate W to the storage device 14 (S213). Then, the evaluation value calculator 25 stores the evaluation value in the DB 22. The transfer device 60 transfers the substrate W for which an error has been measured by the measurement device 40 to the storage device 14, thereby discarding the substrate W. The process of discarding the substrate W whose evaluation value is equal to or larger than the first threshold value, without transferring the substrate W to the processing apparatus 50 that performs the next process, is an example of process (d).

Hardware

Figure 14:
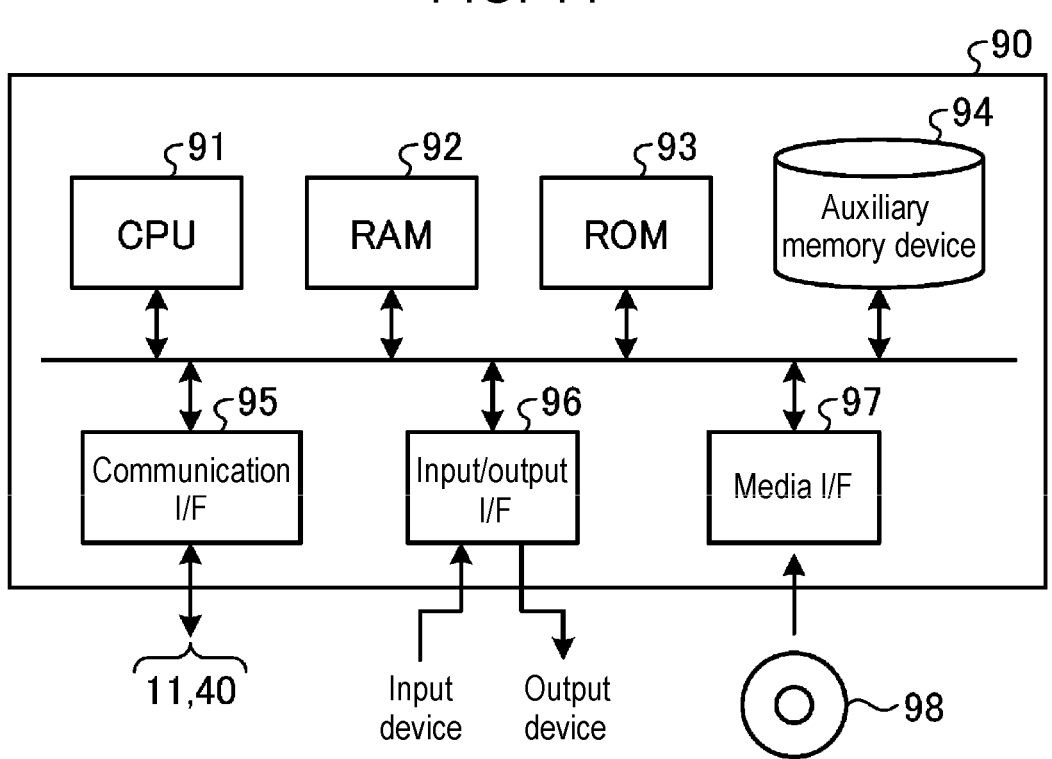
FIG. 14 is a hardware configuration diagram showing an example of a computer that realizes the functions of the evaluation device and the map creating device.

The evaluation device 20 and the map creating device 30 are implemented by a computer 90 configured as shown in FIG. 14, for example. FIG. 14 is a diagram showing an example of the computer 90 that implements the functions of the evaluation device 20 and the map creating device 30. The computer 90 includes a CPU (Central Processing Unit) 91, a RAM (Random Access Memory) 92, a ROM (Read Only Memory) 93, an auxiliary memory device 94, a communication I/F (interface) 95, an input/output I/F 96, and a media I/F 97.

The CPU 91 operates based on programs stored in the ROM 93 or the auxiliary memory device 94 and controls each part. The ROM 93 stores a boot program executed by the CPU 91 when the computer 90 is started, a program depending on the hardware of the computer 90, or the like.

The auxiliary memory device 94 is, for example, an HDD (Hard Disk Drive) or an SSD (Solid State Drive), and is configured to store programs executed by the CPU 91 and data used by the programs. The CPU 91 reads a program from the auxiliary memory device 94, loads the read program onto the RAM 92, and executes the loaded program.

When the computer 90 functions as the evaluation device 20, the communication I/F 95 communicates with the map creating device 30 and the processing apparatus 50 via the communication network 11. When the computer 90 functions as the map creating device 30, the communication I/F 95 communicates with the measurement device 40 and communicates with the evaluation device 20 via the communication network 11. The communication I/F 95 receives data from another device, sends the data to the CPU 91, and sends the data generated by CPU 91 to another device.

The CPU 91 controls an input device such as a keyboard or the like and an output device such as a display or the like via the input/output I/F 96. The CPU 91 acquires a signal inputted from the input device via the input/output I/F 96, and sends the signal to the CPU 91. Moreover, the CPU 91 outputs the generated data to the output device via the input/output I/F 96.

The media I/F 97 reads the program or data stored in the recording medium 98 and stores the program or data in the auxiliary memory device 94. The recording medium 98 is, for example, an optical recording medium such as a DVD (Digital Versatile Disc) or a PD (Phase Change Rewritable Disk), a magneto-optical recording medium such as an MO (Magneto-Optical disk) or the like, a tape medium, a magnetic recording medium, a semiconductor memory, or the like.

When the computer 90 functions as the evaluation device 20, the CPU 91 of the computer 90 executes the program loaded onto the RAM 92 to implement each of the functions of the outputter 21, the chip map provider 23, the deterioration level specifier 24, and the evaluation value calculator 25. The data in the DB 22 are stored in the RAM 92, the ROM 93, or the auxiliary memory device 94.

Further, when the computer 90 functions as the map creating device 30, the CPU 91 of the computer 90 executes the program loaded onto the RAM 92 to implement each of the functions of the error amount specifier 32, the updater 33, and the creator 34. The data in the DB 31 are stored in the RAM 92, the ROM 93, or the auxiliary memory device 94.

The CPU 91 of the computer 90 reads the program loaded onto the RAM 92 from the recording medium 98 and stores the program in the auxiliary memory device 94. As another example, the CPU 91 may acquire the program from another device via a communication line and may store the program in the auxiliary memory device 94.

The first embodiment has been described above. As described above, the substrate processing system 10 according to this embodiment includes the processing apparatus 50-1, the processing apparatus 50-2, the transfer device 60-1, the measurement device 40-1, the map creating device 30-1, and the evaluation device 20. The processing apparatus 50-1 performs processing of the first process on the substrate W. The processing apparatus 50-2 performs processing of the second process on the substrate W after the first process. The transfer device 60-1 transfers the substrate W, which has been processed in the first process by the processing apparatus 50-1, to the processing apparatus 50-2. The measurement device 40-1 measures an error of the substrate W processed in the first process by the processing apparatus 50-1. The map creating device 30-1 creates an error map showing the distribution of errors on each substrate W. The evaluation device 20 calculates, for each substrate W, an evaluation value indicating an importance of the error based on the error map. The transfer device 60-1 discards the substrate W whose evaluation value is equal to or larger than a predetermined first threshold value, without transferring the substrate W to the processing apparatus 50-2. This makes it possible to reduce processing waste.

Further, in the above-described embodiment, the map creating device 30-1 includes the error amount specifier 32, the updater 33, and the creator 34. The error amount specifier 32 specifies, for each substrate W, an error amount, which is a numerical value indicating the amount of error, in each of the chip regions which are regions on the substrate W where multiple chips are arranged. The updater 33 updates, for each substrate W, the error amount in the chip region containing the error to the total value of the error amount in the relevant chip region and the error amounts in other chip regions adjacent to the relevant chip region. The creator 34 specifies, for each substrate W, a predetermined percentage of chip regions in a descending order of error amounts among multiple chip regions on the substrate W, and creates an error map indicating a distribution of the specified chip regions. As a result, it is possible to emphasize the regions on the substrate W where errors are concentrated, and create an error map in which the features of the errors are emphasized. By referring to the error map, it is possible to easily determine the features of the errors.

Further, in the above-described embodiment, the updater 33 updates the error amount in the chip region for the substrate W for which the total value of the error amounts specified for the respective chip regions is equal to or larger than a predetermined value. This makes it possible to reduce the error amount update processing.

Furthermore, in the above-described embodiment, the evaluation device 20 includes the deterioration level specifier 24 and the evaluation value calculator 25. The deterioration level specifier 24 is configured to refer to data in which reference maps as multiple different predetermined error maps are respectively associated with deterioration levels, which are numerical values indicating degrees of deterioration of causes of errors constituting a distribution of the reference maps, and specify, for each substrate W, a deterioration level associated with a reference map having the highest similarity to the error map created by the map creating device 30-1. The evaluation value calculator 25 is configured to calculate, for each substrate W, a product of the deterioration level and the degree of influence of the first process as an evaluation value of the substrates W subjected to the processing of the first process. Accordingly, an evaluation value can be calculated for each substrate W.

Further, in the above-described embodiment, the deterioration level specifier 24 refers to data in which reference maps as multiple different predetermined error maps are respectively associated with the causes of errors in the distribution of the reference maps, and further specifies, for each substrate W, a cause associated with a reference map having the highest similarity to the error map created by the map creating device 30-1. The evaluation device 20 includes the outputter 21 that outputs the cause specified by the deterioration level specifier 24 in association with the identification information of the substrate W. As a result, the user or the like of the substrate processing system 10 can specify the cause of the substrate W being discarded.

Further, in the above-described embodiment, the evaluation value calculator 25 stops the processing apparatus 50-1 when the evaluation value is equal to or larger than the second threshold value, which is larger than the first threshold value. As a result, it is possible to stop the processing apparatus 50-1 that causes a large error, and prevent the substrate W containing the error from being processed.

Further, in the above-described embodiment, the substrate processing method includes processes (a) to (d). In process (a), the error of the substrate W processed in the first process by the processing apparatus 50-1 is measured for each substrate W. In process (b), an error map showing the distribution of errors on the substrate W is created for each substrate W. In process (c), an evaluation value indicating the importance of the error is calculated for each substrate W based on the error map. In process (d), the substrates W whose evaluation values are equal to or larger than a predetermined first threshold value are discarded, without being transferred to the processing apparatus 50-2 for performing the second process after the first process on the substrates W is performed. This makes it possible to reduce processing waste.

Further, in the above-described embodiment, the map creating device 30 includes the error amount specifier 32, the updater 33, and the creator 34. The error amount specifier 32 specifies, for each substrate W, an error amount, which is a numerical value indicating an amount of errors, with respect to each of multiple chip regions, which are regions on the substrate W where chips are arranged. The updater 33 updates, for each substrate W, the error amount in the chip region containing the error to the total value of the error amount in the relevant chip region and the error amounts in other chip regions adjacent to the relevant chip region. The creator 34 specifies, for each substrate W, a predetermined percentage of chip regions in a descending order of error amounts among multiple chip regions on the substrate W, and creates an error map indicating a distribution of the specified chip regions. As a result, it is possible to emphasize the regions on the substrate W where errors are concentrated, and create an error map in which the features of the errors are emphasized. By referring to the error map, it is possible to easily determine the features of the errors.

Others

The technique disclosed in the subject application is not limited to the above-described embodiments, and various modifications may be made within the scope of the gist thereof.

For example, in the above-described embodiment, the error measurement is performed on the substrate W each time when processing of one process is performed, and whether or not to perform processing of the next process on the substrate W is determined according to the magnitude of the error amount. However, the technique disclosed herein is not limited thereto. For example, after processing of multiple processes is performed, the error measurement may be performed on the substrate W, and whether or not to perform processing of the next process on the substrate W may be determined according to the magnitude of the error amount. Even in this case, the error measurement is performed on the substrate W after processing of at least one process other than the last process is performed, and whether or not to perform processing of the next process on the substrate W is determined according to the magnitude of the error amount.

Further, in the above-described embodiment, the evaluation device 20 and each map creating device 30 are implemented by separate devices. However, the technique disclosed herein is not limited thereto. The evaluation device 20 and each map creating device 30 may be implemented by one device.

In addition, the respective components in the above-described embodiment are classified by functions according to main processing contents in order to facilitate understanding of the configuration of the substrate processing system 10. Therefore, the present disclosure is not limited by the method of classifying the components or by the names of the components. The configuration of the substrate processing system 10 according to the present embodiment may be divided into a larger number of components according to the processing contents, or may be divided so that one component can perform a larger number of processes.

In addition, the embodiments disclosed this time should be considered to be exemplary and not restrictive in all respects. Indeed, the above-described embodiments may be embodied in many different forms. In addition, the above-described embodiments may be omitted, substituted, or modified in various ways without departing from the scope and spirit of the appended claims.

EXPLANATION OF REFERENCE NUMERALS

W: substrate, 10: substrate processing system, 11: communication network, 12: processing group, 13: storage device, 14: storage device, 20: evaluation device, 21: outputter, 22: DB, 220: reference map table, 221: product ID, 222: individual table, 223: influence table, 224: product ID, 225: individual table, 226: evaluation value table, 227: product ID, 228: individual table, 229: substrate ID, 230: individual table, 23: chip map provider, 24: deterioration level specifier, 25: evaluation value calculator, 30: map creating device, 31: DB, 310: error table, 32: error amount specifier, 33: updater, 34: creator, 40: measurement device, 50: processing apparatus, 60: transfer device, 70: chip region, 71: particles, 72: chip region, 73: chip region, 74: measurement position, 75: chip region, 76: chip region, 90: computer, 91: CPU, 92: RAM, 93: ROM, 94: auxiliary memory device, 95: communication I/F, 96: input/output I/F, 97: media I/F, 98: recording medium

What is claimed is:

1. A substrate processing system, comprising:
a measurement device configured to measure errors of substrates after the substrates are subjected to processing of a first process by a first processing apparatus that performs processing of the first process on the substrates;
a transfer device configured to transfer the substrates between apparatuses including the first processing apparatus, a second processing apparatus that performs processing of a second process on the substrates after the first process, and the measurement device;
a map creating device configured to create, for each of the substrates, an error map indicating a distribution of the errors on the substrates after each of the first process and the second process; and
an evaluation device configured to calculate, for each of the substrates, an evaluation value indicating a degree of importance of the errors based on the error map and communicates with each of the first process and the second process via a communication network,
wherein the evaluation device instructs the transfer device on a transfer destination of a first storage device or a second storage device of the substrates subjected to the first process according to a determination result as to whether or not the evaluation value is equal to or larger than a predetermined first threshold value;
wherein when the evaluation device determines that the evaluation value is equal to or larger than the predetermined first threshold value, the evaluation device instructs the transfer device to discard the substrates subjected to the first process from the first storage device without transferring the substrates to the second processing apparatus and wherein when the evaluation device determines that the evaluation value is less than the predetermined first threshold value, the evaluation device instructs the transfer device to transfer the substrates subjected to the first process from the second storage device to the second processing apparatus for the second process.

2. The substrate processing system of claim 1, wherein the map creating device includes: an error amount specifier configured to specify, for each of the substrates, an error amount, which is a numerical value indicating an amount of errors, with respect to each of chip regions, which are regions on the substrates where chips are arranged.

3. The substrate processing system of claim 2, wherein the map creating device includes:
an updater configured to update, for each of the substrates, the error amount in the chip region containing the errors to a total value of the error amount in the chip region containing the errors and error amounts in other chip regions adjacent to the chip region containing the errors; and
a creator configured to specify, for each of the substrates, a predetermined percentage of chip regions in a descending order of error amounts among the chip regions on the substrates and create an error map indicating a distribution of the specified chip regions.

4. The substrate processing system of claim 3, wherein the updater updates the error amounts in the chip regions for the substrates having the total value of the error amounts specified for the chip regions equal to or larger than a predetermined value.

5. The substrate processing system of claim 4, wherein the evaluation device includes:
a deterioration level specifier configured to refer to data in which reference maps as different predetermined error maps are respectively associated with deterioration levels, which are numerical values indicating degrees of deterioration of causes of errors constituting a distribution of the reference maps, and specify, for each of the substrates, a deterioration level associated with the reference map having the highest similarity to the error map created by the map creating device; and
an evaluation value calculator configured to calculate, for each of the substrates, a product of the deterioration level and a degree of influence of the first process as the evaluation value of the substrates subjected to the processing of the first process.

6. The substrate processing system of claim 5, wherein the deterioration level specifier refers to data in which the reference maps as different predetermined error maps are associated with the causes of errors in the distribution of the reference maps, and further specifies, for each of the substrates, a cause associated with the reference map having the highest similarity to the error map created by the map creating device, and
wherein the evaluation device includes an outputter configured to output the cause specified by the deterioration level specifier in association with identification information of each of the substrates.

7. The substrate processing system of claim 6, wherein the evaluation value calculator stops the first processing apparatus when the evaluation value is equal to or larger than a second threshold value larger than the first threshold value.

8. The substrate processing system of claim 1, wherein the map creating device includes:
an error amount specifier configured to specify, for each of the substrates, an error amount, which is a numerical value indicating an amount of errors, with respect to each of chip regions, which are regions on the substrates where chips are arranged;
an updater configured to update, for each of the substrates, the error amount in the chip region containing the errors to a total value of the error amount in the chip region containing the errors and error amounts in other chip regions adjacent to the chip region containing the errors; and a creator configured to specify, for each of the substrates, a predetermined percentage of chip regions in a descending order of error amounts among the chip regions on the substrates and create an error map indicating a distribution of the specified chip regions.

9. The substrate processing system of claim 1, wherein the map creating device includes:

an error amount specifier configured to specify, for each of the substrates, an error amount, which is a numerical value indicating an amount of errors, with respect to each of chip regions, which are regions on the substrates where chips are arranged.

10. The substrate processing system of claim 1, wherein the evaluation device includes:

a deterioration level specifier configured to refer to data in which reference maps as different predetermined error maps are respectively associated with deterioration levels, which are numerical values indicating degrees of deterioration of causes of errors constituting a distribution of the reference maps, and specify, for each of the substrates, a deterioration level associated with the reference map having the highest similarity to the error map created by the map creating device; and an evaluation value calculator configured to calculate, for each of the substrates, a product of the deterioration level and a degree of influence of the first process as the evaluation value of the substrates subjected to the processing of the first process.

* * * * *